United States Patent
Kuroda

(10) Patent No.: US 8,744,349 B2
(45) Date of Patent: Jun. 3, 2014

(54) MULTI-STACK SEMICONDUCTOR INTEGRATED CIRCUIT DEVICE

(75) Inventor: Tadahiro Kuroda, Kanagawa (JP)

(73) Assignee: Keio University, Tokyo (JP)

( * ) Notice: Subject to any disclaimer, the term of this patent is extended or adjusted under 35 U.S.C. 154(b) by 275 days.

(21) Appl. No.: 13/501,879

(22) PCT Filed: Oct. 8, 2010

(86) PCT No.: PCT/JP2010/067727
§ 371 (c)(1),
(2), (4) Date: May 11, 2012

(87) PCT Pub. No.: WO2011/046071
PCT Pub. Date: Apr. 21, 2011

(65) Prior Publication Data
US 2012/0217658 A1 Aug. 30, 2012

(30) Foreign Application Priority Data
Oct. 15, 2009 (JP) .................................. 2009-237872

(51) Int. Cl.
*H04B 5/00* (2006.01)
*H04B 7/00* (2006.01)

(52) U.S. Cl.
USPC ........................................ 455/41.1; 455/41.2

(58) Field of Classification Search
CPC ...... H04B 5/00; H04B 5/0025; H04B 5/0031; H04B 5/0075; H04B 5/0081; H04B 5/0087; H04B 5/02; H04W 4/008
USPC ........................ 455/41.1, 41.2, 66.1; 257/686
See application file for complete search history.

(56) References Cited

U.S. PATENT DOCUMENTS

| | | | |
|---|---|---|---|
| 2004/0029329 A1* | 2/2004 | Borghs et al. | 438/167 |
| 2009/0021974 A1 | 1/2009 | Nonomura et al. | |
| 2009/0027162 A1* | 1/2009 | Forster | 340/10.1 |
| 2011/0039493 A1 | 2/2011 | Kuroda | |
| 2011/0040909 A1* | 2/2011 | Abdulla | 710/71 |

FOREIGN PATENT DOCUMENTS

| | | |
|---|---|---|
| JP | 2005-228981 A | 8/2005 |
| JP | 2005-348264 A | 12/2005 |
| JP | 2006-50354 A | 2/2006 |

(Continued)

OTHER PUBLICATIONS

D. Mizoguchi et al., "A 1.2GB/s/pin Wireless Superconnected based on Inductive Inter-Chip Signaling (IIS)", IEEE International Solid-State Circuits Conference (ISSCC '04), Dig. Tech. Papers, Feb. 2004, (10 pages).

(Continued)

*Primary Examiner* — Nguyen Vo
(74) *Attorney, Agent, or Firm* — Westerman, Hattori, Daniels & Adrian, LLP

(57) ABSTRACT

The invention relates to a multi-stack semiconductor integrated circuit device where communication between semiconductor chips can be efficiently carried out by bypassing a number of chips. Each semiconductor chip that forms a multi-stack semiconductor integrated circuit device having a stack structure where four or more semiconductor chips having the same shape are stacked on top of each other is provided with: a first coil for transmission/reception for communication between chips over a long distance; and a second coil for transmission/reception for communication between chips over a short distance, of which the size is smaller than that of the above-described first coil for transmission/reception.

5 Claims, 14 Drawing Sheets

(56) References Cited

FOREIGN PATENT DOCUMENTS

| | | |
|---|---|---|
| JP | 2006-66454 A | 3/2006 |
| JP | 2006-105630 A | 4/2006 |
| JP | 2006-173415 A | 6/2006 |
| JP | 2006-173986 A | 6/2006 |
| JP | 2007-305143 A | 11/2007 |
| JP | 2008-117532 A | 5/2008 |
| JP | 2008-126934 A | 6/2008 |
| JP | 2008-146248 A | 6/2008 |
| JP | 2009-26792 A | 2/2009 |
| JP | 2009-197669 A | 9/2009 |
| WO | 2009/069532 A1 | 6/2009 |

OTHER PUBLICATIONS

N. Miura et al., "Analysis and Design of Transceiver Circuit and Inductor Layout for Inductive Inter-chip Wireless Superconnect", Symposium on VLSI Circuits, Dig. Tech. Papers, pp. 246-249, Jun. 2004.

N. Miura et al., "Cross Talk Countermeasures in Inductive Inter-chip Wireless Superconnect", in Proc. IEEE Custom Integrated Circuits Conference (CICC '04), Oct. 2004 (4 pages).

N. Miura et al., "A 195 Gb/s 1.2W-3D-Stacked Inductive Inter-Chip Wireless Superconnect with Transmit Power Control Scheme", IEEE International Solid-State Circuits Conference (ISSCC '05), Dig. Tech. Papers, pp. 264, 265, 597, Feb. 2005.

N. Miura et al., "A 1Tb/s 3W Inductive-Coupling Transceiver for Inter-Chip Clock and Data Link", IEEE International Solid-State Circuits Conference (ISSCC '06), Dig. Tech. Papers, pp. 11-13, Feb. 2006.

N. Miura, et al., A 0.14pJ/b Inductive Coupling Inter-Chip Data Transceiver with Digitally-Controlled Precise Pulse Shaping, IEEE International Solid-State Circuits Conference (ISSCC '07) Dig. Tech. Papers, pp. 358, 359, 608, Feb. 2007.

N. Miura et al., "An 11Gb/s Inductive-Coupling Link with Burst Transmission," IEEE International Solid-State Circuits Conference (ISSCC '08), Dig. Tech. Papers, Feb. 2008 (3 pages).

Sugimori et al., "A 2Gb/s 15pJ/b/chip Inductive-Coupling Programmable Bus for NAND Flash Memory Stacking", IEEE International Solid-State Circuits Conference (ISSCC '09), Dig. Tech. Papers, Feb. 2009 (3 pages).

M. Saito, et al., "47% Power Reduction and 91% Area Reduction in Inductive-Coupling Programmable Bus for NAND Flash Memory Stacking," IEEE Custom Integrated Circuits Conference (CICC '09), Dig. Tech. Papers, Sep. 2009 (4 pages).

International Search Report of PCT/JP2010/067727, mailing date of Nov. 9, 2010.

* cited by examiner (a)

(b)

(a)

(b)

(c)

(a)

(b)

(a)

(b)

MULTI-STACK SEMICONDUCTOR INTEGRATED CIRCUIT DEVICE

TECHNICAL FIELD

The present invention relates to a multi-stack semiconductor integrated circuit device, and in particular, to a structure of a multi-stack semiconductor integrated circuit device where a number of semiconductor chips, such as of flash memories, are stacked on top of each other and communication between semiconductor chips can be carried out efficiently with low power consumption by bypassing a number of chips.

BACKGROUND ART

In recent years, a number of memory chips, such as flash memory chips, have been stacked on top of each other in order to meet the demand for an increase in the capacity of semiconductor memories. With regards to this, in the case where signals are transmitted and received between chips via bonding wires, a problem arises such that the number of bonding wires is tremendous, which restricts the number of chips stacked on top of each other.

Therefore, the present inventor has proposed an electronic circuit where communication is carried out between IC chips that are stacked on top of each other through inductive coupling via coils formed of wires on the chips (see Patent Documents 1 to 7 and Non-Patent Documents 1 to 9).

The use of this technology makes it possible for data to be sent and received between a number of IC chips through wireless communication. As a result, wires for data communication become unnecessary, and therefore, the number of bonding wires can be reduced and the number of chips that are stacked on top of each other can be increased.

Non-Patent Documents 8 and 9 report that 64 NAND flash memory chips and one controller chip are stacked on top of each other for the communication between chips through inductive coupling where the controller can access any of the NAND flash memory chips at random, for example. As a result, it is possible to implement a solid-state drive (SSD) with a large capacity within one package.

In this case, coils used for the communication through inductive coupling are formed of wires on the IC chips. Though the distance for communication may slightly vary depending on the performance of the communication circuit, wireless communication over the distance that is approximately ⅓ to 1/1 of the diameter of the coils becomes possible.

In Non-Patents Documents 8 and 9, for example, communication is carried out over a distance of 120 μm using coils having sides of 200 μm. In this example, the thickness of one IC chip is 60 μm, including the thickness of the adhesive, and therefore, communication between every other IC chip is possible by bypassing one IC chip. Accordingly, data communication is possible between any chips desired from among the 64 chips by repeating data transfer one after another between chips that are close to each other in the upward or downward direction.

PRIOR ART DOCUMENTS

Patent Documents

Patent Document 1: Japanese Unexamined Patent Publication 2005-228981
Patent Document 2: Japanese Unexamined Patent Publication 2005-348264
Patent Document 3: Japanese Unexamined Patent Publication 2006-050354
Patent Document 4: Japanese Unexamined Patent Publication 2006-066454
Patent Document 5: Japanese Unexamined Patent Publication 2006-105630
Patent Document 6: Japanese Unexamined Patent Publication 2006-173986
Patent Document 7: Japanese Unexamined Patent Publication 2006-173415

Non-Patent Documents

Non-Patent Document 1: D. Mizoguchi et al., "A 1.2 Gb/s/pin Wireless Superconnect based on Inductive Inter-chip Signaling (IIS)," IEEE International Solid-State Circuits Conference (ISSCC '04), Dig. Tech. Papers, pp. 142-143, 517, February 2004
Non-Patent Document 2: N. Miura et al., "Analysis and Design of Transceiver Circuit and Inductor Layout for Inductive Inter-chip Wireless Superconnect," Symposium on VLSI Circuits, Dig. Tech. Papers, pp. 246-249, June 2004
Non-Patent Document 3: N. Miura et al., "Cross Talk Countermeasures in Inductive Inter-Chip Wireless Superconnect," in Proc. IEEE Custom Integrated Circuits Conference (CICC '04), pp. 99-102, October 2004
Non-Patent Document 4: N. Miura, D. Mizoguchi, M. Inoue, H. Tsuji, T. Sakurai, and T. Kuroda, "A 195 Gb/s 1.2 W 3D-Stacked Inductive Inter-Chip Wireless Superconnect with Transmit Power Control Scheme," IEEE International Solid-State Circuits Conference (ISSCC '05), Dig. Tech. Papers, pp. 264-265, February 2005
Non-Patent Document 5: N. Miura, D. Mizoguchi, M. Inoue, K. Niitsu, Y. Nakagawa, M. Tago, M. Fukaishi, T. Sakurai, and T. Kuroda, "A 1 Tb/s 3 W Inductive-Coupling Transceiver for Inter-Chip Clock and Data Link," IEEE International Solid-State Circuits Conference (ISSCC '06), Dig. Tech. Papers, pp. 424-423, February 2006
Non-Patent Document 6: N. Miura, H. Ishikuro, T. Sakurai, and T. Kuroda, "A 0.14 pJ/b Inductive-Coupling Inter-Chip Data Transceiver with Digitally-Controlled Precise Pulse Shaping," IEEE International Solid-State Circuits Conference (ISSCC '07), Dig. Tech. Papers, pp. 264-265, February 2007
Non-Patent Document 7: N. Miura, Y. Kohama, Y Sugimori, H. Ishikuro, T. Sakurai, and T. Kuroda, "An 11 Gb/s Inductive-Coupling Link with Burst Transmission," IEEE International Solid-State Circuits Conference (ISSCC '08), Dig. Tech. Papers, pp. 298-299, February 2008
Non-Patent Document 8: Y. Sugimori, Y. Kohama, M. Saito, Y. Yoshida, N. Miura, H. Ishikuro, T. Sakurai, and T. Kuroda, "A 2 Gb/s 15 pJ/b/chip Inductive-Coupling Programmable Bus for NAND Flash Memory Stacking," IEEE International Solid-State Circuits Conference (ISSCC '09), Dig. Tech. Papers, pp. 244-245, February 2009
Non-Patent Document 9: M. Saito, Y. Sugimori, Y. Kohama, Y. Yoshida, N. Miura, H. Ishikuro, and T. Kuroda, "47% Power Reduction and 91% Area Reduction in Inductive-Coupling Programmable Bus for NAND Flash Memory Stacking," IEEE Custom Integrated Circuits Conference (CICC '09), Dig. Tech. Papers, pp. 449-452, September 2009

SUMMARY OF THE INVENTION

Problem to be Solved by the Invention

The above-described proposal is based on a basic experiment to prove and confirm that data communication is possible through inductive coupling. In order to apply this to a multi-stack flash memory so that the operation as an actual memory is possible, a concrete method for multi-stacking chips, a method for arranging coils, and a magnetic field coupling repeater circuit are necessary.

Thus, the present inventor has proposed a concrete method for multi-stacking chips, a method for arranging coils, and a magnetic field coupling repeater circuit (see Japanese Patent Application 2007-305143 and Japanese Patent Application 2008-146248).

In addition, a method for forming a quadrilateral coil by alternately connecting wires in different levels layered on an IC chip in order to prevent any unusable space from being created due to the formation of the coil (see Japanese Patent Application 2008-126934). According to this proposal, coils can be arranged in such a manner as to be mixed in with wires for connecting circuits in the IC chip, and thus, the cost for installing coils is low.

Furthermore, the present inventor has proposed the following in terms of the method for stacking a number of IC chips with a lower height. In Japanese Patent Application 2009-197669, for example, IC chips are stacked in spiral step form so that the distance for communication can be made short. As a result, the size of the coils can be reduced, the area for the layout of the coils can be reduced, and the power for transmission can be reduced.

By adopting this proposal, it is possible to stack 128 NAND flash memories, and in addition, a controller chip is stacked on top of that so that the controller chip can access any of the NAND flash memories at random. As a result, an SSD with a large capacity can be implemented in one package.

FIG. 13 is a schematic perspective diagram showing an implement where NAND flash memory chips are stacked on top of each other, and furthermore, a controller chip is stacked on top of that on the basis of the above-described proposal (Japanese Patent Application 2009-197669). Here, coils 52 for transmission and reception are formed on top of the memory array region 51 using wires, which is shown in FIG. 14.

The controller chip 60 repeats data transfer successively when accessing a NAND flash memory chip 50 for data. The power required for data transfer increases in proportion to the number of stacked chips.

In the case where communication is carried out between every other chip using coils having sides of 200 μm as described above, for example, the number of times data transfer takes place required for the controller chip that is stacked at the top of the stack of 128 NAND flash memory chips to access a memory chip at random is, on average, 32 (=128÷2÷2), which is two times greater than when 64 memory chips are stacked on top of each other.

As a result, the power required for data transfer takes up a majority of the power required for the entirety of the SSD system, including the memory operation according to a trial test calculation, and thus, reducing the power required for data transmission has been strongly demanded.

Such power required for data transfer can possibly be reduced by increasing the size of the coils having a greater distance for communication, and thus by reducing the number of times data transfer takes place. Coils having a larger size can be arranged on top of memory arrays by adopting the following proposal by the present inventor.

In the case where coils are installed on top of memory arrays, for example, the coefficient of the inductive-coupling is high due to the sides of the coils being parallel to the bus lines when "parallel coils" having coil elements parallel with the bit lines and the word lines in the memory arrays are used, and thus, a problem arises such that the possibility of a signal for data communication causing noise in a bus line is high.

Therefore, the inventor has proposed using "diagonal coils" having coil elements provided in diagonal directions instead of being parallel with the bit lines and the word lines so that interference between the memory operation and the operation for communication through inductive-coupling can be reduced (see Japanese Patent Application 2008-117532).

Typically, quadrilateral coils are used and arranged diagonally by 45° relative to the bit lines and the word lines. That is to say, the coils are arranged diagonally by 45° relative to the sides of the chips. When such "diagonal coils" are used, interference between the memory operation and the operation for communication through inductive-coupling can be greatly reduced, and therefore, large coils can be provided on top of the memory arrays.

The distance for communication of a coil having sides of 1 mm provided on top of a memory array is approximately 500 μm. In the case where the thickness of a chip together with an adhesive is 60 μm as described above, the distance between the top chip and the bottom chip when nine chips are stacked on top of each other is 480 μm (=60 μm×8). That is to say, data can be transferred to the ninth chip at once by bypassing eight chips when coils having sides of 1 mm are used.

Thus, if communication with a greater number of chips is possible at one time, the number of times data transfer takes place required for data to be transferred to the chip that is the desired destination for communication can be reduced accordingly, and there are such advantages that the time required for data communication and the power consumption can be reduced.

In the case where 128 NAND flash memory chips are stacked on top of each other, for example, the number of times data transfer takes place required for the controller chip stacked at the top to access a memory chip at random is, on average, 8 (=128÷2÷8), which is as small as ¼ as in the above example using coils having sides of 200 μm, and therefore, it is possible for the power required for data transfer to be reduced accordingly.

However, a new problem arises here. An eddy current flows through the bit lines, the words lines and the power supply lines in the memory arrays and prevents the magnetic field from changing, and therefore, the power for transmission that is required for communication increases. When an eddy current flows through these wires that are arranged in the memory arrays with high density, the magnetic field is prevented from changing and the mutual inductance between the transmission and reception coils is reduced, thus making the reception signals smaller.

In order to gain reception signals at the same level, the power for transmission that is accordingly greater is necessary. As a result, the power for transmission required for a transfer at one time is greater, though the number of times data transfer takes place is fewer. The total power required for accessing data is determined by the multiplication of the two, and therefore, how the total power is increased or reduced depends on the effects of this eddy current. However, it is extremely difficult to find these effects from the simulation for analyzing the electromagnetic field, and the precision of the simulation is not sufficiently high.

In the case where the number of stacks makes it impossible to gain an optimal number of chips for divided transfer, data communication is carried out using large coils for the remaining chips resulting from the division of the total number of chips by the optimal number of chips irrespective of the fact that the remaining chips are at a short distance, and thus, power consumption may be wasted. In addition, a similar problem arises when communication is necessary between adjacent semiconductor chips.

In the case where only large coils are used, such a problem arises that data connection cannot be achieved between the memory chip stacked at the top and the controller. The typical size of NAND flash memory chips is 13 mm×9 mm, and a majority of the area of the memory chips is occupied by memory arrays. 1 mm coils can be arranged as in FIG. 14, for example.

The typical size of the controller chip is 4 mm×3 mm. Though the controller is stacked on top of the NAND flash memories, the size of the chips and the size of the coils are greatly different between the controller and the NAND flash memories. Accordingly, as shown in FIG. 15, such a problem arises that the communication coil for the controller cannot be arranged in such a location as to combine with a 1 mm communication coil of a NAND flash memory, as described in the above, by being formed of wires on the controller chip.

In this case, it is possible to form a coil outside of the controller chip that is connected to the transmission/reception circuit in the controller chip using a connection technology such as wire bonding. However, extra cost for the formation and the connection of a coil is needed. Another problem arises such that parasitic capacitance occurs in the path for connecting the coil to the transmission/reception circuit, which accordingly makes the band for the communication path narrower and lowers the speed of data transfer.

Alternatively, a communication chip having a coil and a transmission/reception circuit may be provided in such a location as to be combined with a 1 mm communication coil provided in a NAND flash memory in such a manner that the communication coil and the controller chip can be connected through bonding wires. In this case, however, extra cost is needed in order to manufacture a communication chip and connect the communication coil to the controller chip.

In the case where the size of the coils provided in the NAND flash memories is adjusted to the size of the coil provided in the controller in order to make the communication between the controller and the NAND flash memories smooth, the number of times communication is carried out increases, as can be seen from the above, which leads to an increase in the power consumption.

Accordingly, an object of the present invention is to carry out efficient communication between semiconductor chips by bypassing a number of chips so that the power consumption can be reduced.

Means for Solving Problem (1) In order to solve the above-described problem, the present invention provides a multi-stack semiconductor integrated circuit device having a stack structure where four or more semiconductor chips having the same shape are stacked on top of each other, wherein each semiconductor chip is provided with: a first coil for transmission/reception for communication between chips over a long distance; and a second coil for transmission/reception for communication between chips over a short distance, of which the size is smaller than that of the above-described first coil for transmission/reception.

Thus, two types of coils for transmission/reception, large and small, are provided in the semiconductor chips having the same shape so that different coils for transmission/reception can be used depending on the distance for communication so as not to waste power consumption, and as a result, power consumption can be reduced.

(2) The present invention also provides the multi-stack semiconductor integrated circuit device according to the above (1), wherein the above-described first coil for transmission/reception and the above-described second coil for transmission/reception are polygonal, and the diameter of the circle that inscribes the above-described first coil for transmission/reception and the above-described second coil for transmission/reception is 1 to 3 times greater than the distance for communication between chips that has been set in accordance with the size of the coils.

In order to carry out communication between chips without fail, the diameter of the circle that inscribes the coils may be one or more times greater than the distance for communication between chips that has been set depending on the size of the coils in the case where the first coil for transmission/reception and the second coil for transmission/reception are polygonal. In addition, the diameter of the circle that inscribes the coils should be three or fewer times greater than the distance for the communication between chips in order to suppress the waste of power consumption.

(3) The present invention also provides the multi-stack semiconductor integrated circuit device according to the above (2), wherein the diameter of the circle that inscribes the above-described first coil for transmission/reception is 4 to 36 times greater than the pitch at which the above-described semiconductor chips are stacked on top of each other.

The power consumption can be represented by the product of the number of semiconductor chips through which a magnetic field passes for data communication and the power transmitted by one coil for transmission/reception, and therefore, the power consumption is close to the smallest value in the case where the number of semiconductor chips that are bypassed for data communication is in a range from 4 to 12. Meanwhile, the diameter of the circle that inscribes the coils is one to three times greater, typically two times greater, than the distance for communication between chips, and therefore, the power consumption is 4 (4 chips×1) to 36 (12 chips×3), typically 16 (8 chips×2), times greater than the pitch at which the semiconductor chips are stacked on top of each other.

(4) The present invention also provides the multi-stack semiconductor integrated circuit device according to any of the above (1) to (3), wherein a semiconductor chip, of which the size is smaller than that of the above-described semiconductor chips and which has a different shape and only a third coil for transmission/reception for communication between chips having the same size as that of the above-described second coil for transmission/reception, is stacked on the top or bottom semiconductor chip in the above-described stack structure.

Thus, in the case where a semiconductor chip having a different shape is stacked on a multi-stack structure formed of semiconductor chips having the same shape provided with a smaller, second coil for transmission/reception for communication between chips over a small distance, it is possible to carry out communication between the multi-stack structure and the semiconductor chip having a different shape using a magnetic field by simply providing a third coil for transmission/reception having the same size as the second coil for transmission/reception to the semiconductor chip having a different shape. As a result, it is not necessary to form a coil for transmission/reception that corresponds to the first coil for transmission/reception outside the semiconductor chip having a different shape, and therefore, it is possible to reduce the cost and prevent the speed of data transfer from lowering due to the parasitic capacitance.

(5) The present invention also provides the multi-stack semiconductor integrated circuit device according to any of the above (1) to (4), wherein the above-described multi-stack structure is at least provided with: a first semiconductor chip group where a predetermined number of semiconductor chips are stacked on top of each other in such a manner that a first pair of sides of each semiconductor chip is aligned with that of the semiconductor chip at the bottom, and a second pair of sides of each semiconductor chip is shifted by a predetermined pitch sequentially in a first direction in which the above-described first pair of sides runs; a second semiconductor chip group where a predetermined number of semiconductor chips are stacked on top of each other in such a manner that a second pair of sides of each semiconductor chip is aligned with the second pair of the semiconductor chip at the top of the above-described first semiconductor chip group, and a first pair of sides of each semiconductor chip is shifted by a predetermined pitch sequentially in a second direction in which the above-described second pair of sides runs; a third semiconductor chip group where the same number of semiconductor chips as in the first semiconductor chip group are stacked on top of each other in such a manner that a first pair of sides of each semiconductor chip is aligned with the first pair of sides of the semiconductor chip at the top of the above-described second semiconductor chip group, and a second pair of sides of each semiconductor chip is shifted by a predetermined pitch sequentially in a third direction that is opposite to the above-described first direction; and a fourth semiconductor chip group where the same number of semiconductor chips as in the above-described second semiconductor chip group are stacked on top of each other in such a manner that a second pair of sides of each semiconductor chip is aligned with the second pair of the semiconductor chip at the top of the above-described third semiconductor chip group, and a first pair of sides of each semiconductor chip is shifted by a predetermined pitch sequentially in a fourth direction that is opposite to the above-described second direction.

Thus, in the case where the multi-stack structure is formed of semiconductor chips having the same shape, the semiconductor chips can be stacked in spiral step form by shifting the semiconductor chips by a predetermined pitch sequentially so that no spacers are necessary and the height of the stack can be kept low. As a result, the distance for data communication by bypassing the same number of chips can be made shorter, and thus, the coils can accordingly be made smaller and the power consumption can further be reduced.

(6) The present invention also provides the multi-stack semiconductor integrated circuit device according to any of the above (1) to (5), wherein the above-described semiconductor chips having the same shape are flash memory chips and the above-described semiconductor chip having a different shape is a controller chip for controlling the operation of the above-described flash memories.

By adopting this structure, an SSD with a low power consumption can be formed where the ratio of the power required for data transfer to the power required for the entirety of the SSD system, including the memory operation, is lower than that in the prior art.

Effects of the Invention

According to the disclosed multi-stack semiconductor integrated circuit device, communication between semiconductor chips by bypassing a number of chips can be carried out at a high efficiency, and as a result, the power consumption can be reduced.

BEST MODE FOR CARRYING OUT THE INVENTION

Figure 1:
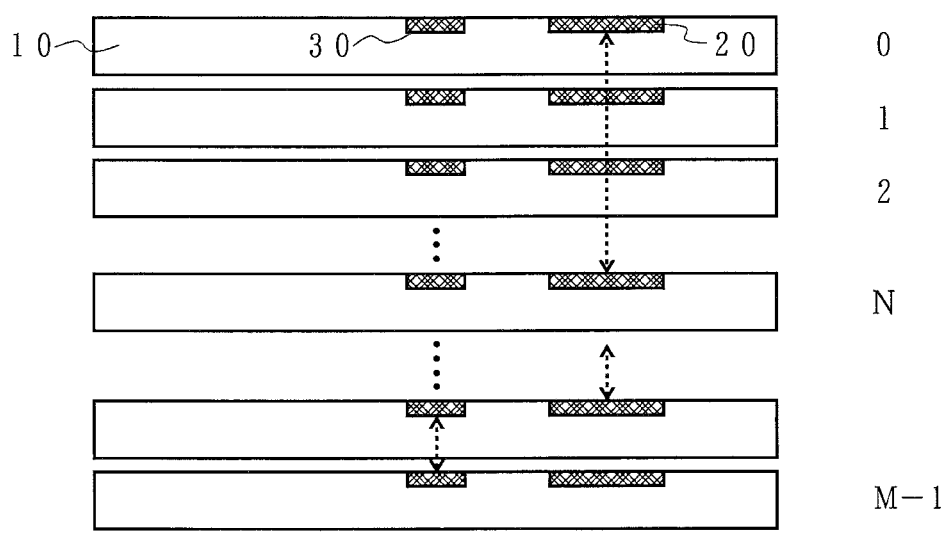
FIG. 1 is a schematic cross-sectional diagram showing a multi-stack semiconductor integrated circuit device according to an embodiment of the present invention.

Here, an embodiment of the present invention is described in reference to FIGS. 1 to 4. FIG. 1 is a schematic cross-sectional diagram showing the multi-stack semiconductor integrated circuit device according to an embodiment of the present invention and the state where M memory chips 10 are stacked on top of each other, where each memory chip 10 is provided with a large coil for transmission/reception 20 for communication between chips over a long distance and a small coil for transmission/reception 30 for communication between chips over a short distance.

Figure 2:
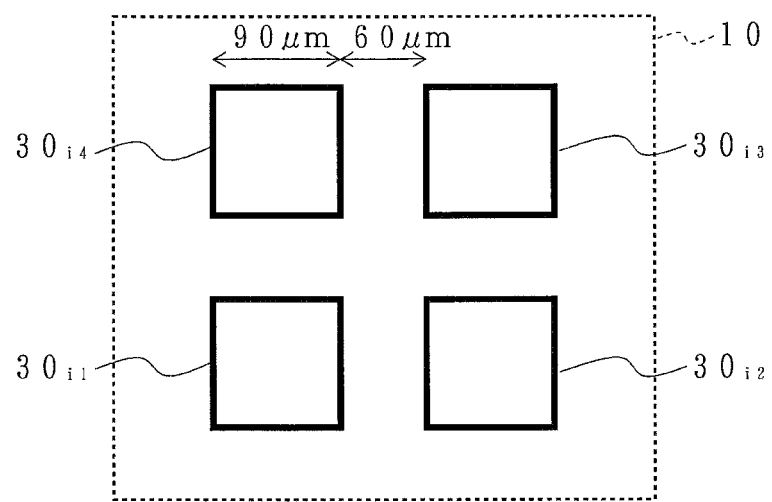
FIG. 2 is a diagram for illustrating the arrangement state of coils for transmission/reception for communication between chips over a short distance.
Figure 3:
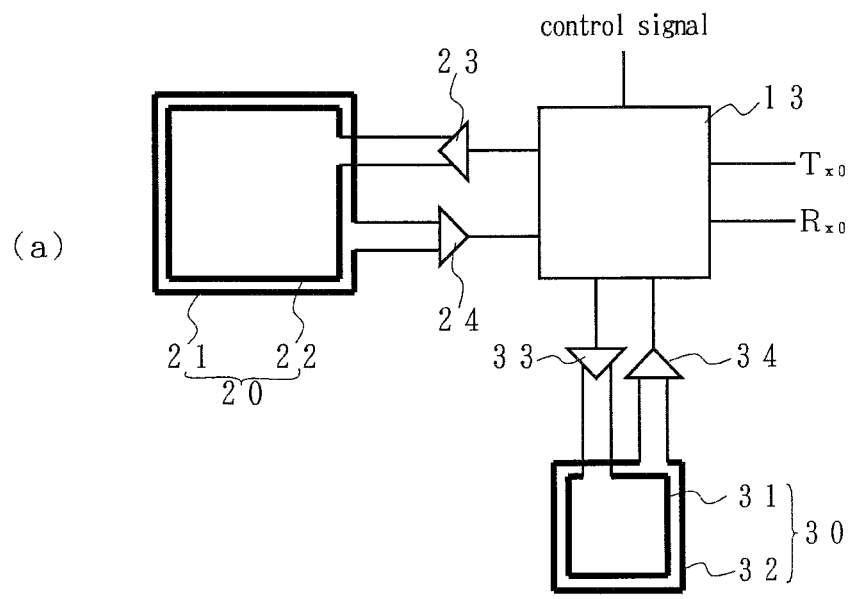
FIGS. 3(a) and 3(b) are diagrams for illustrating the structure of the unit for transmission/reception.
Figure 3:
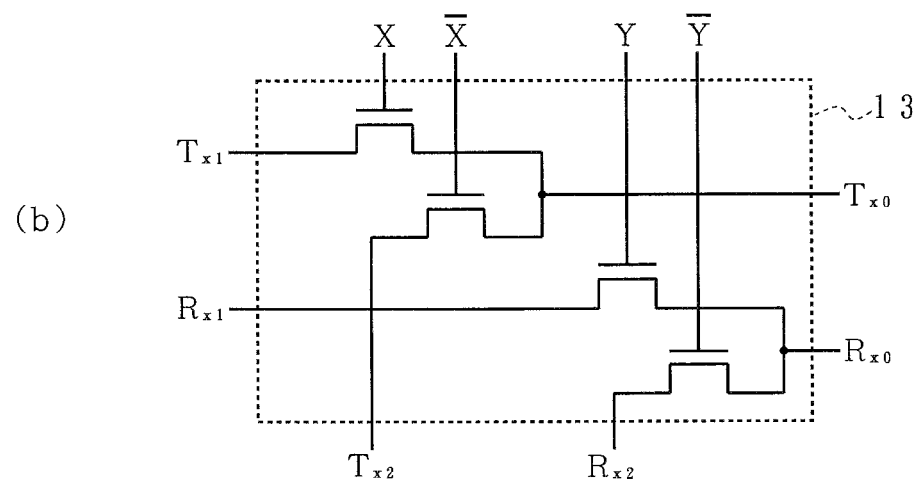
Figure 13:
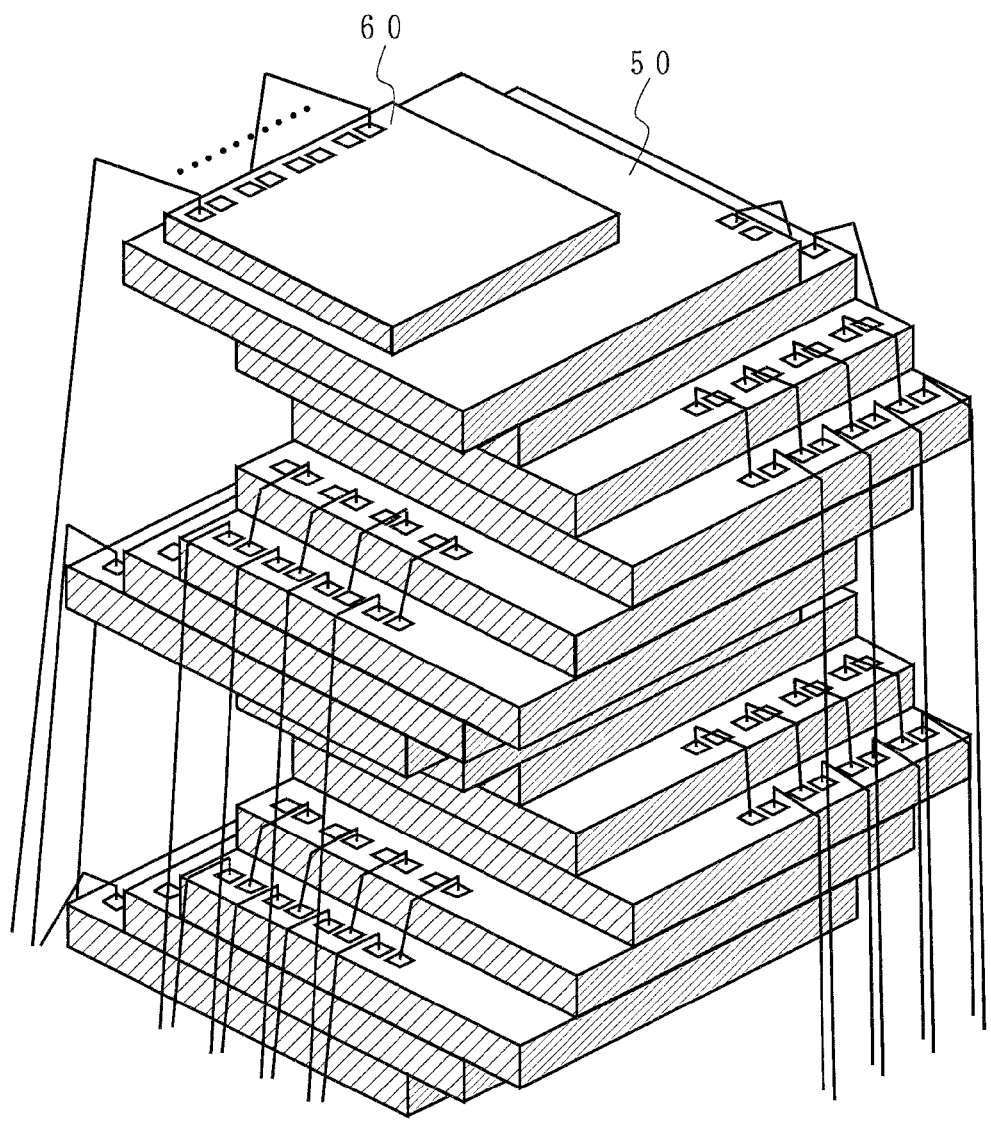
FIG. 13 is a schematic perspective diagram showing the multi-stack NAND flash memory proposed by the present inventor.
Figure 14:
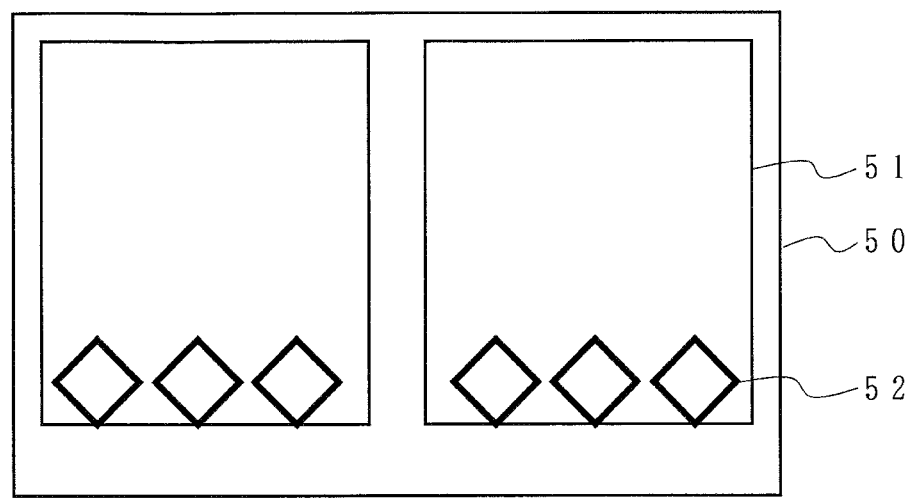
FIG. 14 is a diagram for illustrating the arrangement state of large coils.
Figure 15:
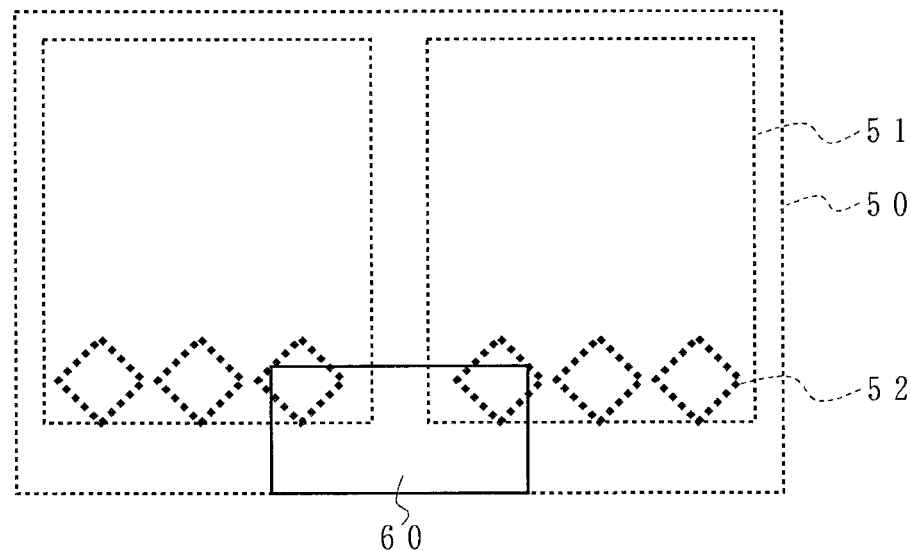
FIG. 15 is a diagram for illustrating the positioning of the controller chip and the memory chips.

In the case where the memory chips 10 are stacked in stair form by sliding them, a number of coils for transmission/reception 30 are provided with the pitch at which the memory chips 10 have been slid. FIG. 2 is a diagram for illustrating the arrangement of coils for transmission/reception 30 in the case where the memory chips are stacked in spiral step form by sliding every other pair of chips in a different direction with a pitch of 150 µm, as shown in FIG. 13. Here, four coils for transmission/reception 30 with a size of 90 µm are arranged with a pitch of 150 µm.

Here, the procedure for stacking memory chips 10 is described.

Memory chip $10_2$: stacked on the memory chip $10_1$ by being shifted in the direction x by 150 µm.

Memory chip $10_3$: stacked on the memory chip $10_2$ by being shifted in the direction x by 150 µm.

Memory chip $10_4$: stacked on the memory chip $10_3$ by being shifted in the direction y by 150 µm.

Memory chip $10_5$: stacked on the memory chip $10_4$ by being shifted in the direction y by 150 µm.

Memory chip $10_6$: stacked on the memory chip $10_5$ by being shifted in the direction -x by 150 µm.

Memory chip $10_7$: stacked on the memory chip $10_6$ by being shifted in the direction -x by 150 µm.

Memory chip $10_8$: stacked on the memory chip $10_7$ by being shifted in the direction -y by 150 µm.

Memory chip $10_9$: stacked on the memory chip $10_8$ by being shifted in the direction -y by 150 µm.

Here, the memory chip $10_9$ is located directly above the memory chip $10_1$.

Next, the corresponding relationships between coils for transmission/reception $30_{ij}$ (here, i corresponds to the chip number and j corresponds to the location where the coil is arranged) that are inductively coupled with each other for the communication between chips are described. In this description, the names have been simplified.

Chip $10_1$ and chip $10_2$: coil $30_{12}$ and coil $30_{21}$
Chip $10_2$ and chip $10_3$: coil $30_{22}$ and coil $30_{31}$
Chip $10_3$ and chip $10_4$: coil $30_{33}$ and coil $30_{42}$
Chip $10_4$ and chip $10_5$: coil $30_{43}$ and coil $30_{52}$
Chip $10_5$ and chip $10_6$: coil $30_{54}$ and coil $30_{63}$
Chip $10_6$ and chip $10_7$: coil $30_{64}$ and coil $30_{73}$
Chip $10_7$ and chip $10_8$: coil $30_{71}$ and coil $30_{84}$
Chip $10_8$ and chip $10_9$: coil $30_{81}$ and coil $30_{94}$ Thus, four coils for transmission/reception 30 are arranged in one memory chip 10 so that communication between chips over a short distance is made possible even in the case where the memory chips 10 are stacked on top of each other by sliding them.

FIG. 3(a) is a schematic diagram showing the structure of the circuit of the unit for transmission/reception where a transmission coil 21 and a reception coil 22 are arranged in a concentric manner in the coil for transmission/reception 20 for communication between chips over a long distance. Transmission data is transmitted to the transmission coil 21 from a control circuit 13 through a transmitter 23. In addition, the reception data received by the reception coil 22 is sent to the control circuit 13 through a receiver 24.

A transmission coil 31 and a reception coil 32 are arranged in a concentric manner in the coil for transmission/reception 30 for communication between chips over a short distance. Transmission data is transmitted to the transmission coil 31 from the control circuit 13 through a transmitter 33. In addition, the reception data received by the reception coil 32 is sent to the control circuit 13 through a receiver 34. The coil for transmission/reception 20 for communication between chips over a long distance and the coil for transmission/reception 30 for communication between chips over a short distance are switched by control signals X and Y that are inputted into the control circuit 13.

FIG. 3(b) is a diagram showing the circuit structure of the control circuit, which is formed of two pairs of MOSFETs to which high and low inputs are applied to the gate electrodes in each pair. In the case where transmission data $T_{x0}$ is inputted, for example, when the MOSFET where a control signal X is inputted into the gate electrode is turned on, the MOSFET into which the X with a bar is inputted is turned off and transmission data $T_{x1}$ is transmitted to a remote memory chip by means of the transmission coil 21.

In the case where the reception coil 22 receives transfer data $R_{x1}$, a control signal Y is inputted into the gate electrode so that the MOSFET connected to the reception coil 22 is turned on, and thus, the reception data $R_{x1}$ is received and transferred as reception data $R_{x0}$ through the control circuit 13. In the case where the coil for transmission/reception for communication between chips over a short distance is used, the control signal may be inverted.

In this case, the transmission coil 21 and the transmission coil 31 are polygonal, typically quadrilateral, and are arranged in the memory array regions in such a manner that all the sides of the coils are diagonal relative to the bit lines and word lines (see Japanese Patent Application 2008-117532). In addition, the length of one side of the transmission coil 21 and the transmission coil 31 is one to three times greater than the set distance for communication between chips.

Figure 4:
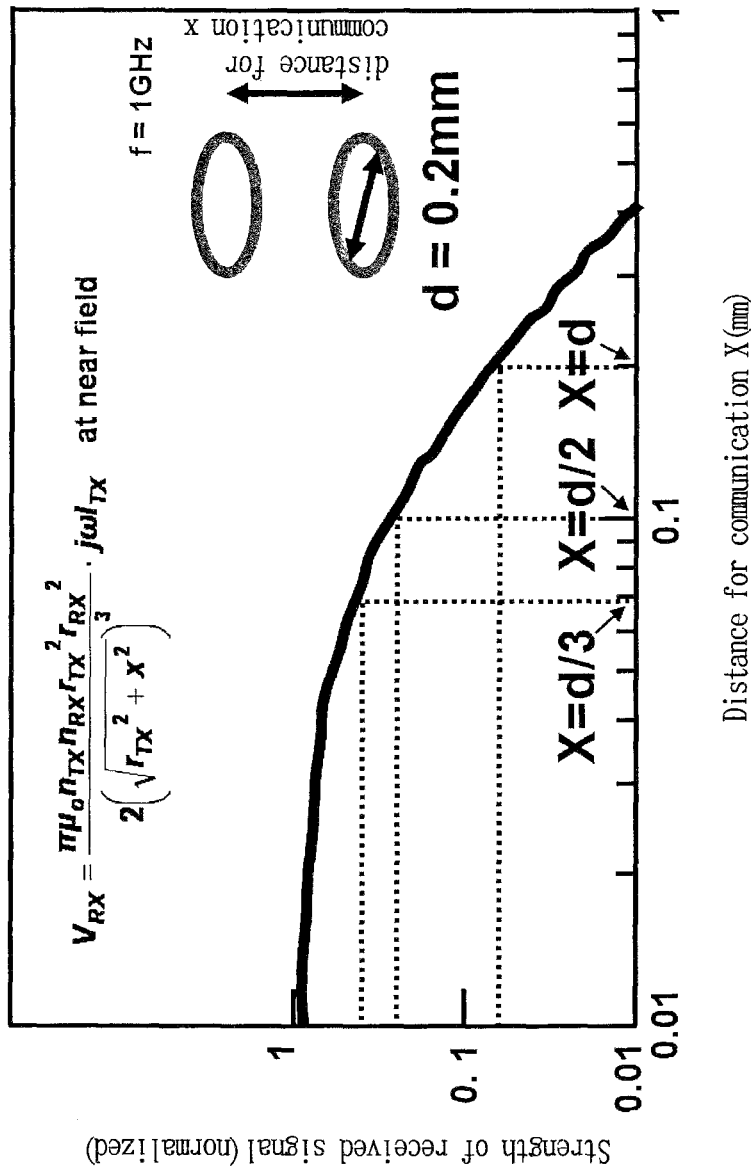
FIG. 4 is a graph for illustrating the dependency of the strength of the received signal on the size of the coils.

FIG. 4 is a graph for illustrating the dependency of the strength of the received signal on the size of the coils, where the strength of the received signal $V_{RX}$ can be found from the theoretical approximation in the figure using the distance for communication x, the radius of the coils r ($r_{TX}$ is the radius of the transmission coil and $r_{RX}$ is the radius of the reception coil), and the number of times the coils are wound n ($n_{TX}$ is the number of times the transmission coil is wound and $n_{RX}$ is the number of times the reception coil is wound). Here, $\mu_0$ is the magnetic permeability in a vacuum, j is the imaginary unit, $I_{TX}$ is the current that flows through the transmission coil, and ω is the frequency in the equation.

As shown in the figure, when the distance for communication x is equal to the diameter of the coils d (=2r), the strength of the received signal $V_{RX}$ is 0.08, which is the same as in the case where the distance for communication is infinitesimal. When the distance for communication x is ½ of the diameter of the coils d, the strength of the received signal $V_{RX}$ is 0.2. When the distance for communication x is ⅓ of the diameter of the coils d, the strength of the received signal $V_{RX}$ is 0.4.

Actual circuits are affected by thermal noise and noise from other integrated circuits, and therefore, test chips were manufactured and many experiments were carried out. The results revealed the following:

1) In the case of a non-sync communication system, the maximum distance for communication is approximately ⅓ of the diameter of the coils.
2) In the case of a sync communication system, the maximum distance for communication is approximately ½ of the diameter of the coils.
3) In the case of a sync communication system having an amplifier in the receiver, the maximum distance for communication is approximately the same as the diameter of the coils.

In the case of a non-sync communication system, there is no reception time, and therefore, the system should be in such a state that reception is always possible. Accordingly, the reception sensitivity cannot help being lowered in order to prevent noise from causing a malfunction when there are no reception signals. The receiver may be provided with input hysteresis so that the receiver does not detect an input signal at a certain level or lower, for example. As a result, a relatively high strength of the received signal is necessary.

In contrast, in the case of a sync communication system, there is reception timing, and therefore, it is not necessary for noise to cause a malfunction when no signal is received, and thus, it is not necessary to lower the reception sensitivity. Accordingly, the received signal merely needs to be sufficiently greater than the noise, and therefore, it is possible to receive a signal with a weaker intensity.

Furthermore, when an amplifier is provided in the initial stage of the receiver, it is possible to amplify and receive a signal with a weaker intensity. Thus, the length of one side of the coils or the diameter of the circle that inscribes the coils may be one to three times greater than the set distance for communication, though the maximum distance for communication differs depending on the communication system.

Thus, the size of the transmission coil 21 for communication between chips over a long distance is determined by the number N of semiconductor chips that are desired to be bypassed for the coupling through a magnetic field and is set to such a value as to provide the number of semiconductor chips for the total power consumption having the smallest value. As described below, it is preferable for N to be in a range from 4 to 12, and the smallest value is gained when N is 8, though it depends on how the semiconductor chips are stacked.

Accordingly, when the total thickness of a semiconductor chip with adhesive is T (μm), the length of one side of the transmission coil 21 is NT×(1~3) (μm), where N=4~12, and therefore, the minimum length is 4×T×(1~3)=4T~12T. Meanwhile, the maximum length is 12×T×(1~3)=12T~36T. Accordingly, the length is set in a range from 4T~36T. Here, the total power for communication is the lowest when N=8, and thus, the length is set in a range of 8T×(1~3)=8T~24T.

In the case where data is desired to be transferred at once to the $9^{th}$ chip by bypassing eight chips, the distance for communication is 480 μm (=60 μm×8) when the total thickness of a chip with adhesive is 60 μm, as described above, and therefore, the length of one side of the transmission coil 21 is 0.48 mm to 1.44 mm.

Meanwhile, the length of one side of the transmission coil 31 for communication between chips over a short distance is also determined by the number of semiconductor chips that are desired to be bypassed for the coupling through a magnetic field. Here, typically, communication is carried out with the next semiconductor chip, and therefore, the length is set to one to three times greater than T μm, that is to say, 1T to 3T. In the case of T=60 μm, as described above, the length is set to one to three times greater than 60 μm, that is to say, 60 μm to 180 μm. The location where the transmission coil 31 is provided may be on top of a memory array or in other places, such as on top of a peripheral circuit. In addition, the transmission coil 31 may be a "parallel coil" or a "diagonal coil."

As shown in FIG. 1, in the case where the number of semiconductor chips that are stacked on top of each other is M, with M=8n+k, and eight chips are bypassed for the coupling through a magnetic field, the data communication over a distance up to 8n chips is carried out by data transfer of (n−1) times using the coil for transmission/reception 20 for communication between chips over a long distance. The coil for transmission/reception 30 for communication between chips over a short distance is used for the remaining k chips so that data transfer is carried out (k−1) times. Alternatively, the coil for transmission/reception 30 for communication between chips over a short distance is used in the case where communication is carried out between semiconductor chips in the set of eight semiconductor chips.

Thus, communication over a long distance and communication over a short distance are switched depending on the number of chips that are stacked and the state of communication so that the power consumption can be made lower than that when the entirety of the communication is carried out by using the large coil for transmission/reception 20 for communication between chips over a long distance with a large power consumption.

Figure 5:
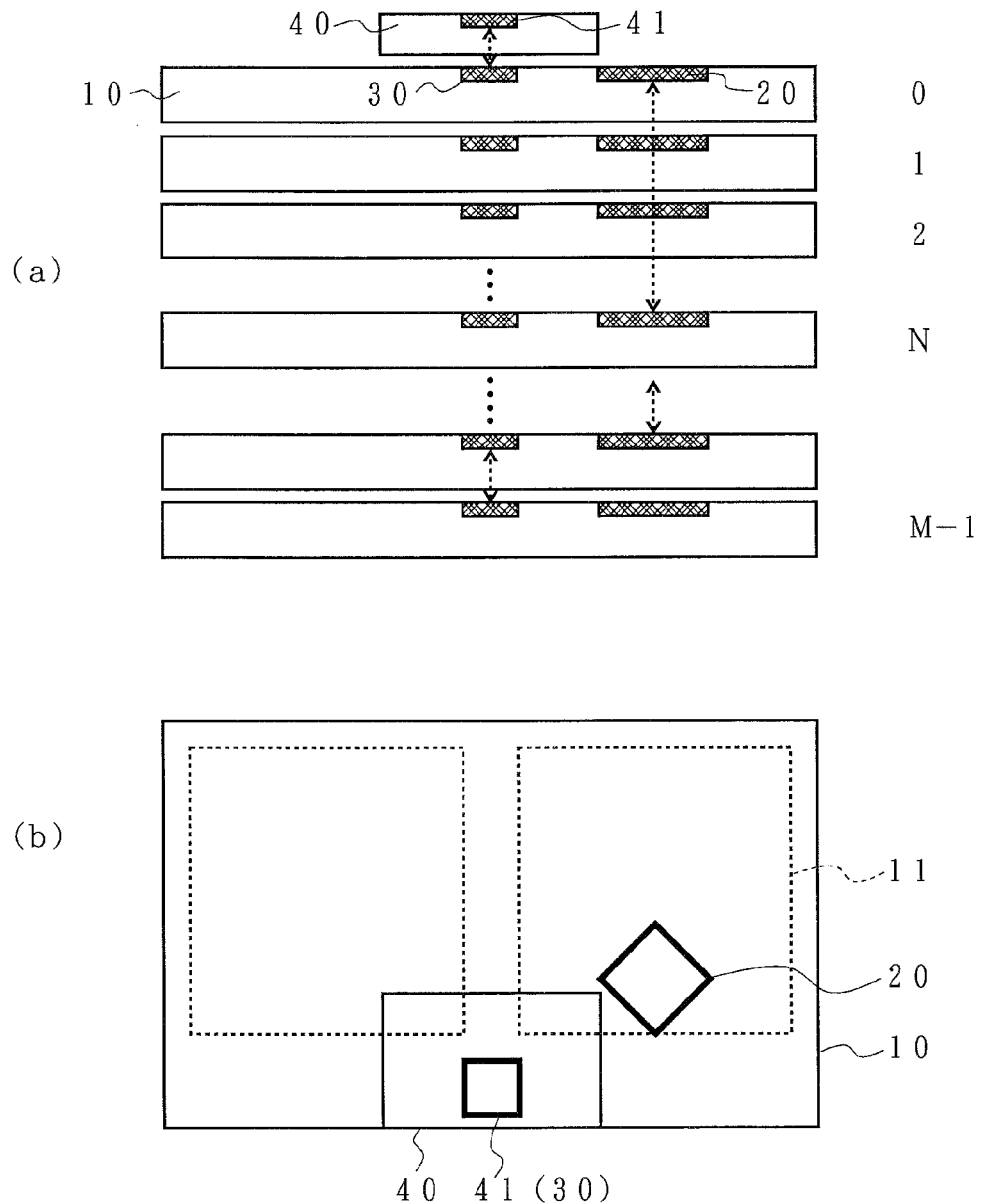
FIGS. 5(a) and 5(b) are diagrams for illustrating the structure in the case where a controller chip is stacked.

FIGS. 5(a) and 5(b) are diagrams for illustrating the structure where a controller chip is stacked. FIG. 5(a) is a schematic cross-sectional diagram and 5(b) is a schematic diagram as viewed from the top. As shown in FIG. 5(a), a controller chip 40 is provided with a coil for transmission/reception 41 having the same size as the coils for transmission/reception 30 for communication between chips over a short distance and is stacked so that the coil for transmission/reception 41 overlaps the coils for transmission/reception 30 for communication between chips over a short distance in a projected manner.

The semiconductor chips, which are memory chips 10, typically flash memory chips, are provided with a coil for transmission/reception 30 for communication over a short distance for a lower power consumption. Therefore, in the case where the stacked controller chip 40 has a size smaller than the memory chips 10, communication with the stacked semiconductor devices becomes possible only by providing a coil for transmission/reception 41 with a small size.

Accordingly, it is not necessary to form an external coil for transmission/reception that corresponds to a coil for transmission/reception 20 for communication over a long distance outside the controller chip 40, and thus, it is possible to reduce the cost, and at the same time, the speed of data transfer can be prevented from lowering due to the parasitic capacitance caused by the wires for the connection with the external coil for transmission/reception.

Here, any type of semiconductor chip can be used, but typically, semiconductor memory chips, such as of NAND memory, are appropriate for this stack structure. In addition, the shape of the main surface of the semiconductor chips is rectangular in the figures, but the same can be applied for squares.

Example 1

Figure 6:
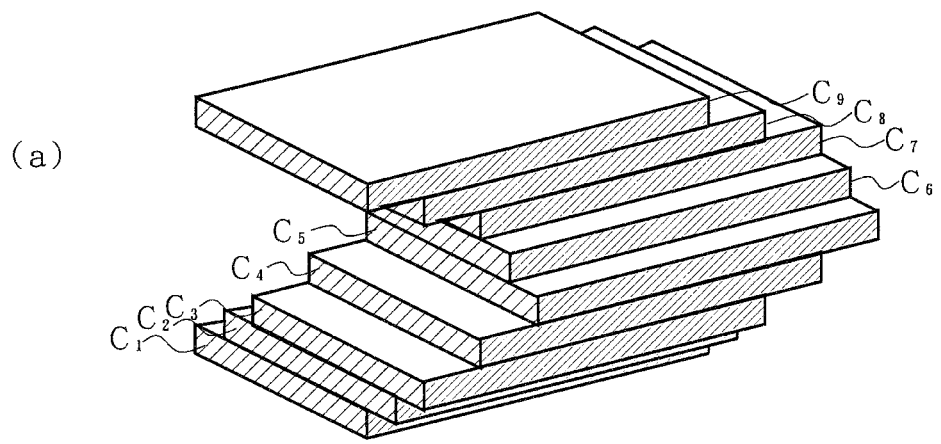
FIGS. 6(a) to 6(c) are diagrams for illustrating the structure of the multi-stack semiconductor integrated circuit device according to Example 1 of the present invention.
Figure 6:
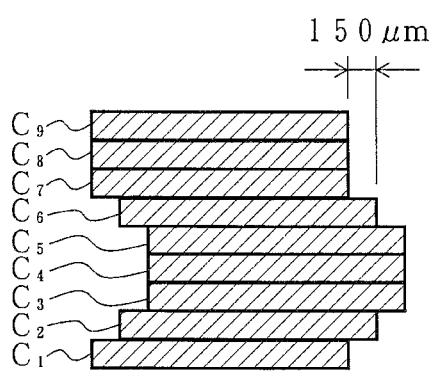
Figure 6:
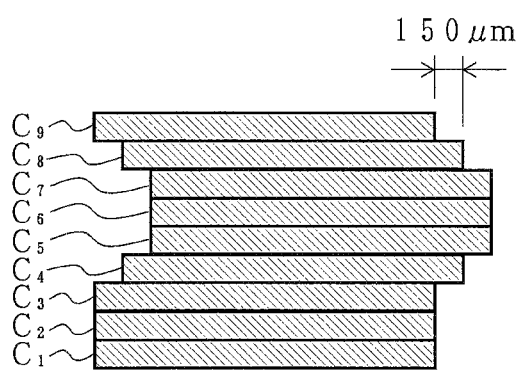
Figure 7:
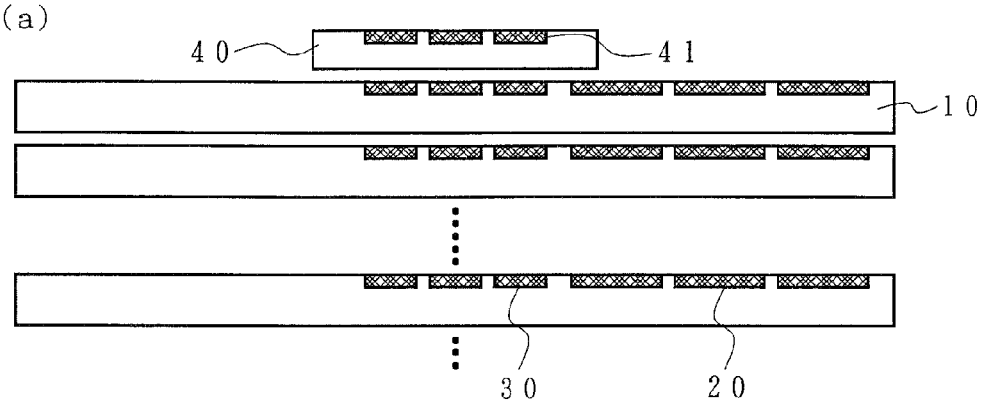
FIGS. 7(a) and 7(b) are diagrams for schematically illustrating the structure where the locations of the coils for transmission/reception are shown.
Figure 7:
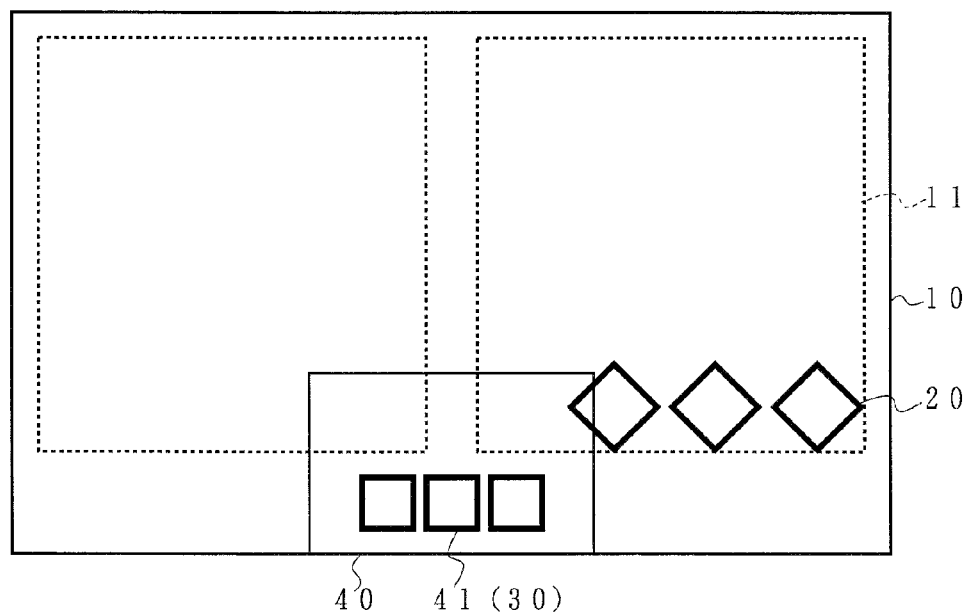

Next, taking the above into consideration, the multi-stack semiconductor integrated circuit device according to Example 1 of the present invention is described in reference to FIGS. 6(a) to 10. FIGS. 6(a) to 6(c) are diagrams for illustrating the structure of the multi-stack semiconductor integrated circuit device according to Example 1 of the present invention, where FIG. 6(a) is a schematic perspective diagram, FIG. 6(b) is a front diagram, and FIG. 6(c) is a side diagram. In addition, FIG. 7(a) is a schematic cross-sectional diagram showing the locations of coils for transmission/reception, and FIG. 7(b) is a schematic perspective diagram.

As shown in FIGS. 6(a) to 6(c), commercially available 16 Gb NAND flash memory chips with a thickness of 25 μm that have been manufactured using a 43 nm device processing technology are stacked on top of each other in spiral step form using an adhesive with a thickness of 5 μm. Here, semiconductor chips are stacked from the bottom in counter-clockwise spiral form with two windings, and the state where eight semiconductor chips are stacked on top of each other is shown here for the sake of convenience. However, in actual devices, 128 semiconductor chips are stacked on top of each other. In addition, the pitch with which the memory chips are slid from each other is 90 μm. Finally, a controller chip is stacked.

As shown in FIGS. 7(a) and 7(b), three diagonal coils with a side of 1.1 mm are provided in a memory array region as coils for transmission/reception 20 for communication between chips over a long distance using wires on the surface of the memory chips 10. In addition, three parallel coils with a side of 90 μm are provided in a peripheral circuit portion as coils for transmission/reception for communication between chips over a short distance. In addition, three parallel coils with a side of 90 μm are also provided as coils for transmission/reception 41 in the controller chip 40, which is stacked so that the coils for transmission/reception 41 overlap the coils for transmission/reception 30 in the memory chips 10. Here, the actual circuit structure is the same as shown in FIG. 2 in the above.

Here, the sliding of the chips in the stack in spiral step form is not shown for the sake of simplicity of the figures, but 4×2 coils for transmission/reception 30 are actually provided with the same pitch (150 μm) as that with which the memory chips are slid from each other. In the case of communication with a chip two steps away, 5×5 coils 30 for transmission/reception are provided.

Figure 8:
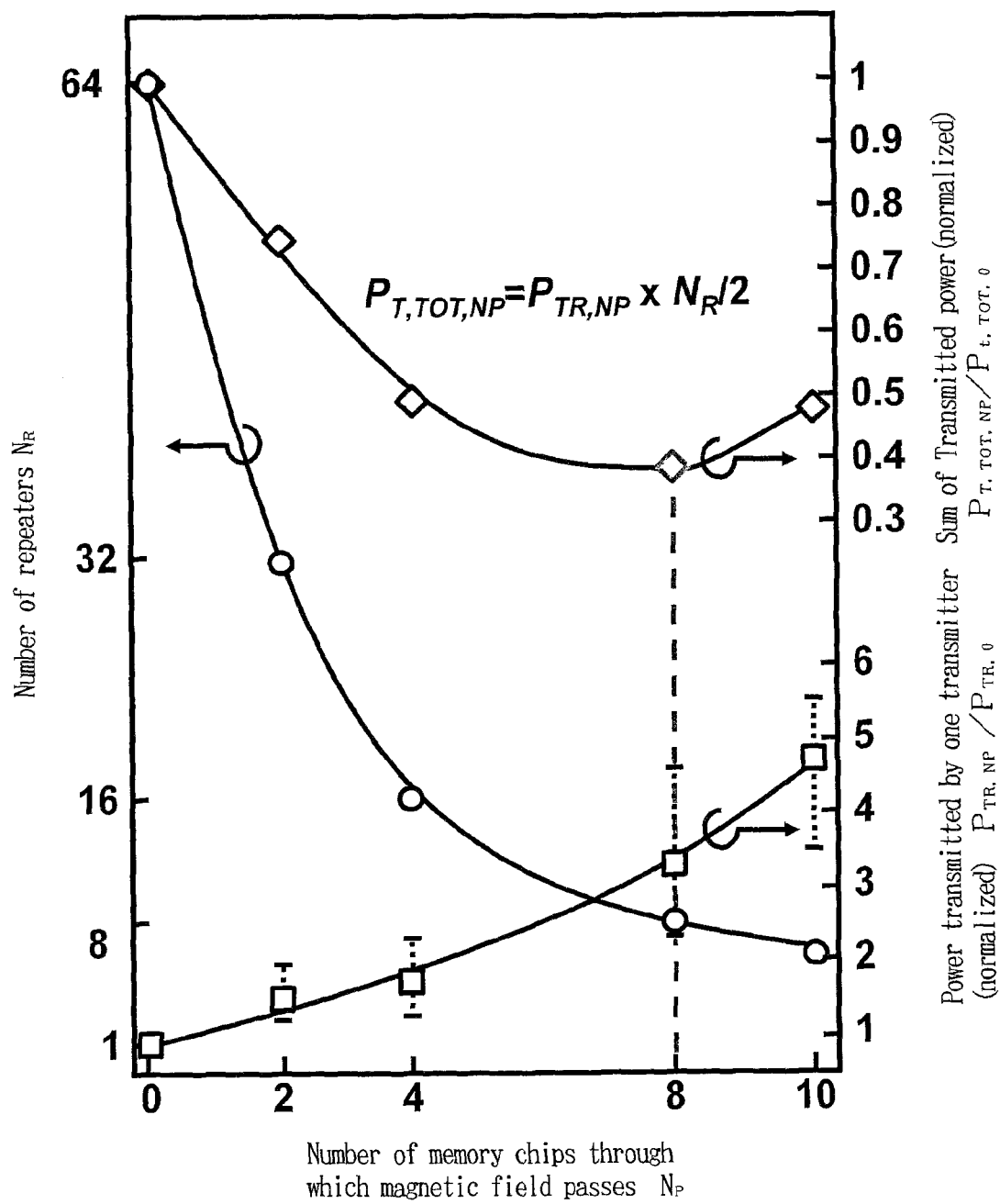
FIG. 8 is a graph for illustrating the dependency of the transmitted power on the number of semiconductor chips through which a magnetic field passes.

FIG. 8 is a graph for illustrating the dependency of the transmitted power on the number of semiconductor chips through which a magnetic field passes, where a multi-stack structure where a number of memory chips are stacked on top of each other is sandwiched between chips for transmission/reception having a coil with a side of 1.1 mm for communication through inductive coupling and a transmitter from the top and the bottom. Data communication is carried out using a magnetic field that passes through the memory array regions in the flash memory chips, and the minimum transmitted power that is required for the bit error ratio in the data communication to be $10^{-14}$ or less was found through experiments. In addition, 10 multi-stack samples were manufactured for each case where the number of stacks in the multi-stack structure was 0 (there were no memory chips in between), 2, 4, 8 and 10 in order to show the results of measurement.

The right longitudinal axis shows the measured value of the minimum transmitted power that was required when normalized using the value of the transmitted power that was required when there were no memory chips in between. It can be seen quantitatively from the results that when the number of memory chips that are bypassed is great, the mutual inductance is accordingly smaller due to the effects of the eddy current, and the transmitted power must be high in order to cancel these effects. In the case where the magnetic field passes through eight memory chips (N=8), for example, it can be seen that the power of the transmitter should be 2.5 to 4.5 times greater than in the case where the magnetic field passes through no memory chips (N=0).

However, the number of times of data transfer is ⅛ of the case when N=0, and therefore, the total transmitted power is 2.5/8 to 4.5/8, that is to say, 0.3 to 0.55 times smaller, and thus, approximately 0.4 times smaller as the average value. When the number of memory chips through which a magnetic field passes is greater than this, the opposite effects strongly appear such that the power transmitted by the transmitter should be higher than the effects gained by the number of times of data transfer being low, and as a result, the total transmitted power is higher.

Meanwhile, when the number of memory chips through which a magnetic field passes is smaller than this, the effects gained by the number of times of data transfer not being smaller appear stronger than the effects gained by reducing the power transmitted by the transmitter, and as a result, the total transmitted power is higher as well. That is to say, the total transmitted power is minimum in the case where the magnetic field passes through approximately eight memory chips. In actuality, the effects of reducing the power that match the case where the number of memory chips that are bypassed is eight when the number of memory chips through which a magnetic field passes ranges from 4 to 12. Accordingly, it is desirable for the size of the first coils to be determined so that 4 to 12 memory chips can be bypassed.

Figure 9:
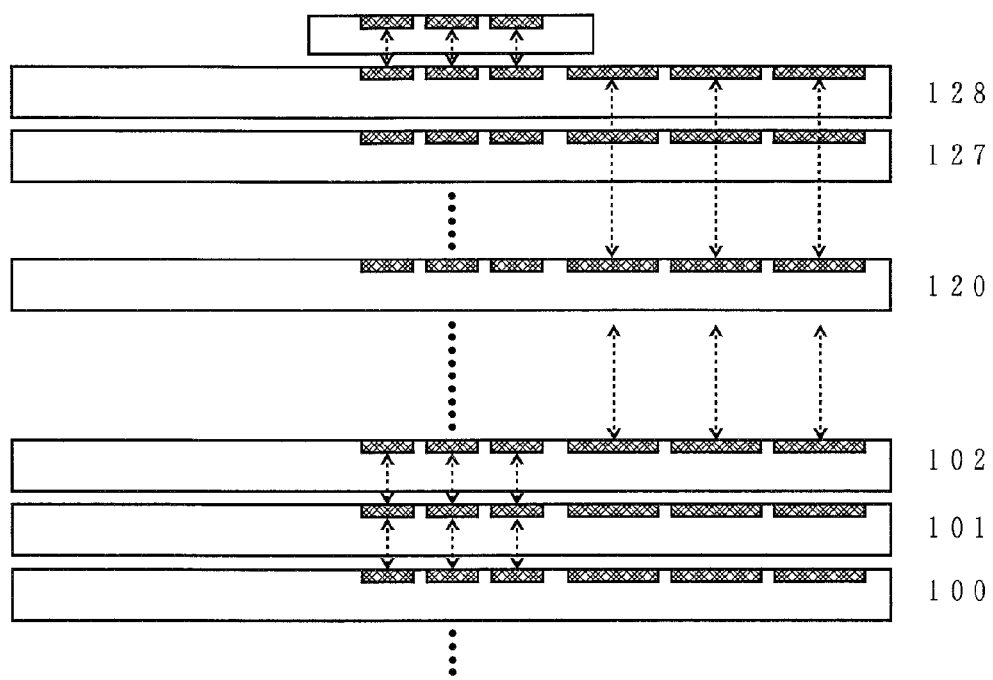
FIG. 9 is a diagram for schematically illustrating the state of communication between chips.

FIG. 9 is a schematic diagram for illustrating a state of communication between chips where a case in which the controller chip 40 data accesses the memory chip 10 stacked $100^{th}$ from the bottom is considered, for example. The controller chip 40 carries out data communication with the memory chip 10 that is stacked at the top ($128^{th}$ from the bottom) using inductive coupling between the coils for transmission/reception 30 for communication between chips over a short distance.

Next, the coils for transmission/reception are switched by the control circuit so that the $128^{th}$ memory chip 10 transfers data to the memory chip 10 that is stacked $120^{th}$ from the bottom using inductive coupling between the coils for transmission/reception 20 for communication between chips over a long distance. In the same manner, data is transferred between the $120^{th}$ and the $111^{th}$ or between the $111^{th}$ and the $102^{nd}$.

In the case where the $102^{nd}$ memory chip 10 communicates with the $100^{th}$ memory chip 10, it is possible to use inductive coupling between the coils for transmission/reception 20 for communication between chips over a long distance. However, in an assumed case where the $102^{nd}$ memory chip 10 requires a transmitted power that is four times greater than usual in order to overcome the effects of the eddy current, the total power consumption is rather small when inductive coupling between the coils for transmission/reception 30 for communication between chips over a short distance is used.

Thus, the coils for transmission/reception are switched by the control circuit again so that inductive coupling between the coils for transmission/reception 30 for communication between chips over a short distance is used, and data transfer is repeated, for example, from the $102^{nd}$ memory chip 10 to the $101^{st}$ memory chip 10 and from the $101^{st}$ memory chip 10 to the $100^{th}$ memory chip 10.

Figure 10:
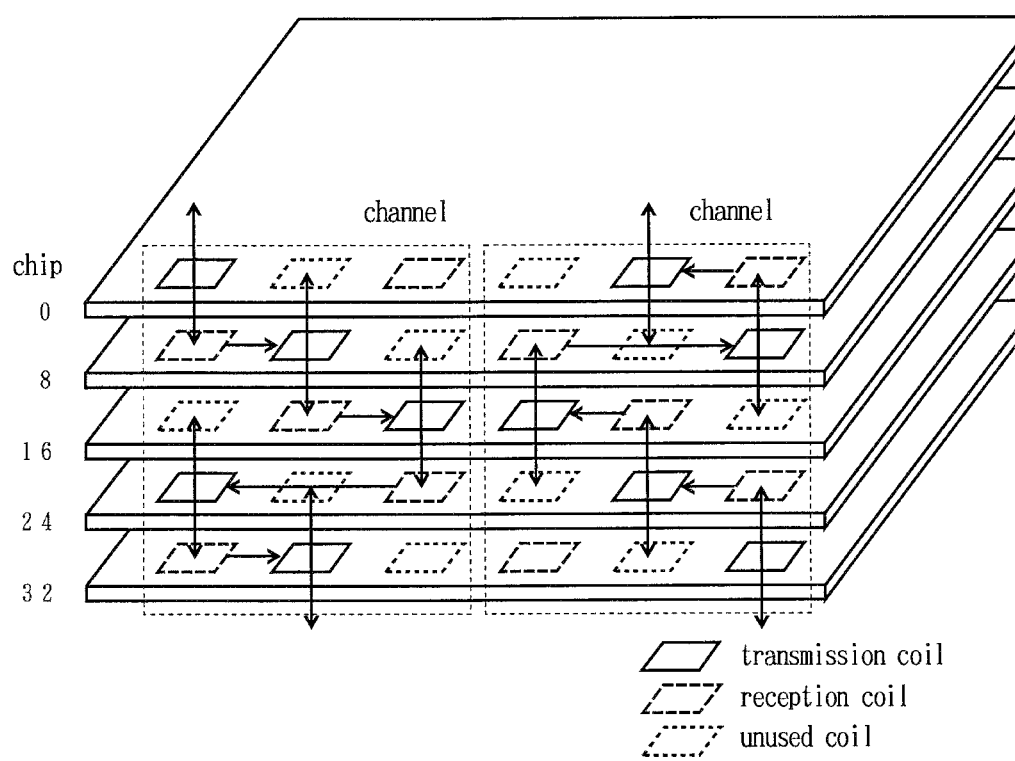
FIG. 10 is a diagram for illustrating the concrete procedure in the state of communication between chips.

FIG. 10 is a diagram for illustrating the concrete procedure in the state of communication between chips, where though data exchange between chips by bypassing eight memory chips is described, the exact same can be applied for a case of communication between chips over a short distance. As described above, three coils for transmission/reception are provided so as to be controlled in a transmission mode, a reception mode and an unused mode, respectively. These controls are possible through the connection to either the power supply potential or the ground potential using two bonding wires shown in FIG. 11.

As shown in FIG. 10, transmission data is inputted into the transmission coil of the adjacent coils for transmission/reception by the control circuit using a reception coil in the memory chip in the $9^{th}$ level (chip 8) and is received by the reception coil of the coils for transmission/reception provided in the corresponding location in the memory chip in the $17^{th}$ level (chip 16) so as to be transferred to the adjacent coils for transmission/reception in the same manner.

Next, the data received by the memory chip in the $25^{th}$ level (chip 24) is inputted into the transmission coil of the coils for transmission/reception that are skipped by one level so as to be received by the reception coil of the coils for transmission/reception provided in the corresponding location in the memory chip in the $33^{rd}$ level (chip 32). Thus, the operation mode for each coil for transmission/reception is preset so that the coils for transmission/reception above and below the location corresponding to the coil for transmission/reception in the transmission mode is always in an unused mode. Accordingly, pieces of the transmission data do not interfere with each other, and therefore, no standby time is required for transfer and data can be transferred precisely.

Thus, in Example 1 of the present invention, two types of coils for transmission/reception with different sizes are provided in advance so that used coils are switched in accordance with the required distance for communication, and therefore, the total power consumption can be further reduced.

In addition, a coil for transmission/reception of which the size makes it possible for the coil to be mounted on the controller chip for communication between chips over a short distance is provided, and therefore, it is unnecessary to externally provide a large coil for communication between chips over a long distance in order to carry out communication between the controller chip and the memory chips. As a result, the extra cost for the formation and connection of a coil can be avoided, and the speed of data transfer can be prevented from lowering due to the parasitic capacitance.

Example 2

Figure 11:
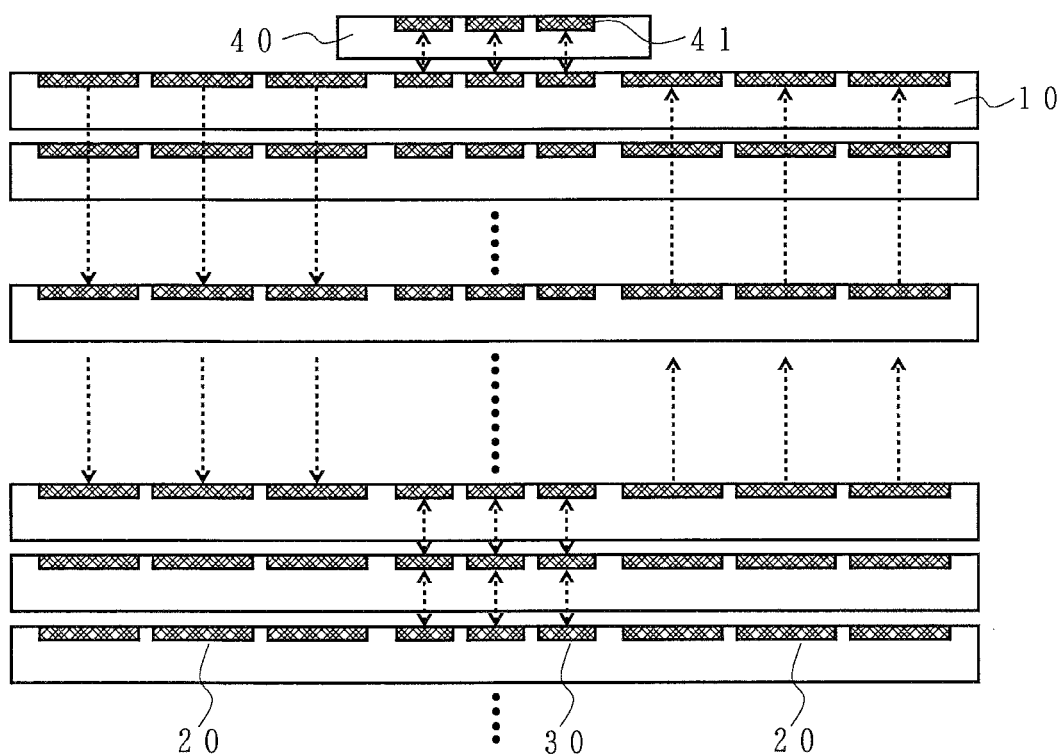
FIG. 11 is a schematic cross-sectional diagram showing the multi-stack semiconductor integrated circuit device according to Example 2 of the present invention.

Next, the multi-stack semiconductor integrated circuit device according to Example 2 of the present invention is described in reference to FIG. 11. FIG. 11 is a schematic cross-sectional diagram showing the multi-stack semiconductor integrated circuit device according to Example 2 of the present invention of which the basic structure is the same as in Example 1, but two sets of coils for transmission/reception 20 for communication between chips over a long distance are provided, where one set consists of three coils.

As shown in the figure, one set on one side is used for communication in the downward direction, that is to say, writing data in a memory, and one set on the other side is used for communication in the upward direction, that is to say, reading out of data from the memory, so that it is possible to read out data and write in data at the same time.

Figure 12:
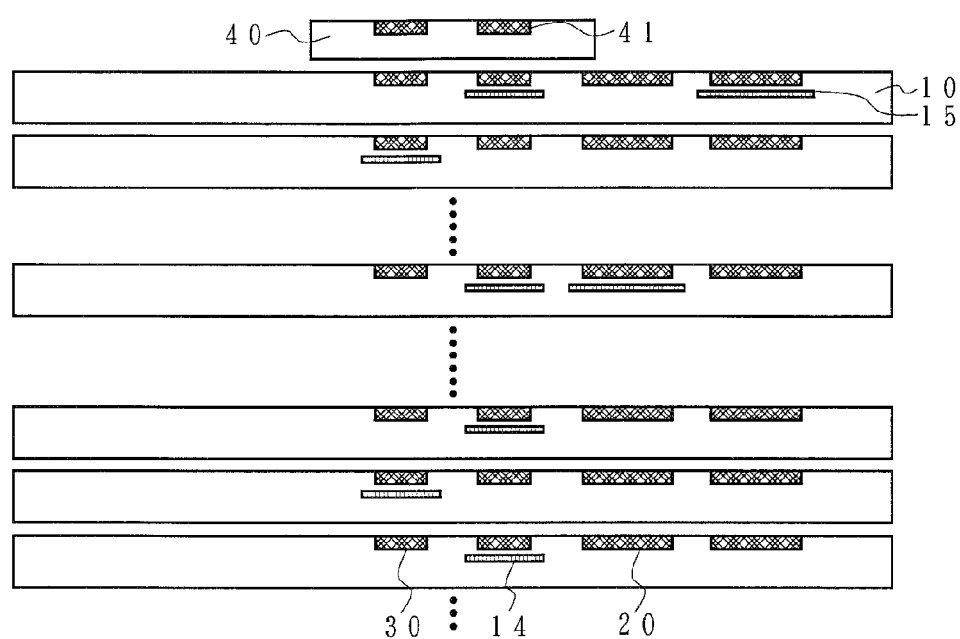
FIGS. 12(a) and 12(b) are diagrams for illustrating the structure of the multi-stack semiconductor integrated circuit device according to Example 3 of the present invention.
Figure 12:
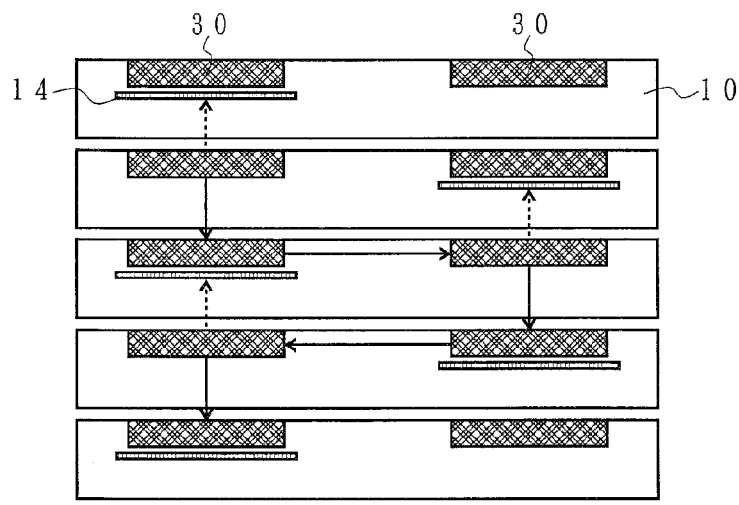

Next, the multi-stack semiconductor integrated circuit device according to Example 3 of the present invention is described in reference to FIGS. 12(a) and 12(b). FIG. 12(a) is a schematic cross-sectional diagram showing the multi-stack semiconductor integrated circuit device according to Example 3 of the present invention, and FIG. 12(b) is a diagram for illustrating a state of communication in the multi-stack semiconductor integrated circuit device according to Example 3 of the present invention.

As shown in FIG. 12(a), in this Example 3, two coils for transmission/reception 20 for communication between chips over a long distance and two coils for transmission/reception 30 for communication between chips over a short distance are used, and magnetic field attenuating films 14, 15 are provided in order to attenuate the magnetic field that passes through the chips using a metal film or a grid wire. In this case, magnetic field attenuating films 15 are provided alternately to a place on one coil for transmission/reception 30 side between the two coils for transmission/reception 30 of the memory chips 10 that are adjacent above and below, where the place is between the coil for transmission/reception 30 and the semiconductor substrate.

In the case where the number of chips through which the magnetic field passes is N, no magnetic field attenuating films are provided for (N−1) coils for transmission/reception 20 for communication between chips over a long distance, and magnetic film attenuating films 14 are provided alternately to a place on one coil for transmission/reception 30 side between the two coils for transmission/reception 30 of the memory chips 10 between which the (N−1) memory chips are sandwiched from the top and the bottom, where the place is between the coil for transmission/reception 30 and the semiconductor substrate.

FIG. 12(b) is a diagram for illustrating a state of communication between coils for transmission/reception for communication between chips over a short distance. The coils for transmission/reception 30 that have received transmission data transfer data to an adjacent coil for transmission/reception 30 by means of the control circuit, and data is transmitted to the next memory chip 10 using the transmission coil in this coil 30 for transmission/reception. This procedure is repeated so that data communication with the memory chip 10 at the bottom is possible.

At this time, the magnetic film attenuating films are provided alternately so that pieces of transmission data can be prevented from interfering between upper and lower memory chips 10 that are aligned in the same projected location, and thus, data transfer is possible without requiring any standby time. In this case as well, two sets of coils for transmission/reception 20 for communication between chips over a long distance are provided, where one set consists of two coils so that one is dedicated for communication in the upward direction with the other for communication in the downward direction.

Though examples where memory chips and a controller chip are stacked on top of each other are described in the above, the invention is not limited to these examples. In the case where semiconductor chips with certain specifications are stacked on top of each other and a semiconductor chip with another specification is stacked on top of this, the present invention can be used to gain the same effects.

The invention claimed is:

1. A multi-stack semiconductor integrated circuit device having a stack structure comprising:
    four or more semiconductor chips having the same shape and being stacked on top of each other, wherein each semiconductor chip comprises:
        a first coil for transmission/reception for communication between chips over a long distance; and
        a second coil for transmission/reception for communication between chips over a short distance, of which the size is smaller than that of said first coil for transmission/reception
    wherein a semiconductor chip, of which the size is smaller than that of said semiconductor chips and which has a different shape and only a third coil for transmission/reception for communication between chips having the same size as that of said second coil for transmission/reception, is stacked on the top or bottom semiconductor chip in said stack structure.

2. The multi-stack semiconductor integrated circuit device according to claim 1, wherein
    said first coil for transmission/reception and said second coil for transmission/reception are polygonal, and
    the diameter of the circle that inscribes said first coil for transmission/reception and said second coil for transmission/reception is 1 to 3 times greater than the distance for communication between chips that has been set in accordance with the size of the coils.

3. The multi-stack semiconductor integrated circuit device according to claim 2, wherein the diameter of the circle that inscribes said first coil for transmission/reception is 4 to 36 times greater than the pitch at which said semiconductor chips are stacked on top of each other.

4. The multi-stack semiconductor integrated circuit device according to claim 1, wherein said multi-stack structure comprises at least:

a first semiconductor chip group where a predetermined number of semiconductor chips are stacked on top of each other in such a manner that a first pair of sides of each semiconductor chip is aligned with that of the semiconductor chip at the bottom, and a second pair of sides of each semiconductor chip is shifted by a predetermined pitch sequentially in a first direction in which said first pair of sides runs;

a second semiconductor chip group where a predetermined number of semiconductor chips are stacked on top of each other in such a manner that a second pair of sides of each semiconductor chip is aligned with the second pair of the semiconductor chip at the top of said first semiconductor chip group, and a first pair of sides of each semiconductor chip is shifted by a predetermined pitch sequentially in a second direction in which said second pair of sides runs;

a third semiconductor chip group where the same number of semiconductor chips as in the first semiconductor chip group are stacked on top of each other in such a manner that a first pair of sides of each semiconductor chip is aligned with the first pair of sides of the semiconductor chip at the top of said second semiconductor chip group, and a second pair of sides of each semiconductor chip is shifted by a predetermined pitch sequentially in a third direction that is opposite to said first direction; and a fourth semiconductor chip group where the same number of semiconductor chips as in said second semiconductor chip group are stacked on top of each other in such a manner that a second pair of sides of each semiconductor chip is aligned with the second pair of the semiconductor chip at the top of said third semiconductor chip group, and a first pair of sides of each semiconductor chip is shifted by a predetermined pitch sequentially in a fourth direction that is opposite to said second direction.

5. The multi-stack semiconductor integrated circuit device according to claim 1, wherein said semiconductor chips having the same shape are flash memory chips and said semiconductor chip having a different shape is a controller chip for controlling the operation of said flash memories.

* * * * *